(12) United States Patent
Valli et al.

(10) Patent No.: US 10,171,916 B2
(45) Date of Patent: Jan. 1, 2019

(54) SYSTEM AND METHOD FOR A HIGH-OHMIC RESISTOR

(71) Applicant: Infineon Technologies AG, Neubiberg (DE)

(72) Inventors: Luca Valli, Villach (AT); Benno Muehlbacher, St. Magdalen (AT); Richard Gaggl, Poertschach am Woerthersee (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 117 days.

(21) Appl. No.: 15/142,682

(22) Filed: Apr. 29, 2016

(65) Prior Publication Data

US 2017/0318393 A1    Nov. 2, 2017

(51) Int. Cl.
| | |
|---|---|
| H04R 19/00 | (2006.01) |
| H02M 3/07 | (2006.01) |
| H03F 3/183 | (2006.01) |
| H03F 3/187 | (2006.01) |
| H03F 3/45 | (2006.01) |
| H04R 3/06 | (2006.01) |

(52) U.S. Cl.
CPC ............ *H04R 19/005* (2013.01); *H02M 3/07* (2013.01); *H03F 3/183* (2013.01); *H03F 3/187* (2013.01); *H03F 3/45475* (2013.01); *H04R 3/06* (2013.01); *H03F 2200/03* (2013.01); *H03F 2200/144* (2013.01); *H03F 2203/45526* (2013.01); *H04R 2201/003* (2013.01); *H04R 2410/00* (2013.01); *H04R 2410/03* (2013.01)

(58) Field of Classification Search
CPC .. H04R 19/005; H04R 2201/003; H04R 3/06; H04R 2410/00; H04R 2410/03; H02M 3/07; H03F 3/183; H03F 2200/03; H03F 2200/144; H03F 3/187; H03F 2203/45526
USPC ......... 381/113, 174, 175; 257/360, 386, 533
See application file for complete search history.

(56) References Cited

U.S. PATENT DOCUMENTS

| | | | |
|---|---|---|---|
| 2002/0125949 A1* | 9/2002 | Stenberg | ................. H03F 3/183 330/250 |
| 2014/0079254 A1* | 3/2014 | Kim | ......................... H04R 3/00 381/174 |

FOREIGN PATENT DOCUMENTS

JP          2001203543      *  7/2001   ............... H03F 1/34

* cited by examiner

*Primary Examiner* — Vivian Chin
*Assistant Examiner* — Douglas Suthers
(74) *Attorney, Agent, or Firm* — Slater Matsil, LLP

(57) ABSTRACT

According to an embodiment, a circuit includes a high-Ω resistor including a plurality of semiconductor junction devices coupled in series and a plurality of additional capacitances formed in parallel with the plurality of semiconductor junction devices. Each semiconductor junction device of the plurality of semiconductor junction devices includes a parasitic doped well capacitance configured to insert a parasitic zero in a noise transfer function of the high-Ω resistor. Each additional capacitance of the plurality of additional capacitances is configured to adjust a parasitic pole in the noise transfer function of the high-Ω resistor in order to compensate for the parasitic zero.

26 Claims, 10 Drawing Sheets

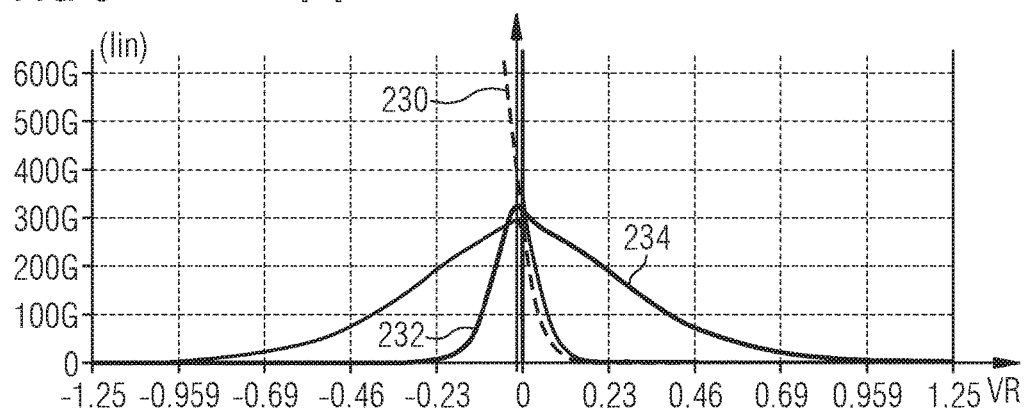

SYSTEM AND METHOD FOR A HIGH-OHMIC RESISTOR

TECHNICAL FIELD

The present invention relates generally to electrical circuits, and, in particular embodiments, to a system and method for a high-ohmic bias resistor.

BACKGROUND

Transducers convert signals from one domain to another and are often used in sensors. A common transducer used as a sensor that is seen in everyday life is a microphone, a sensor for audio signals with a transducer that converts sound waves to electrical signals.

Microelectromechanical system (MEMS) based sensors include a family of transducers produced using microfabrication techniques. MEMS, such as a MEMS microphone, gather information from the environment through measuring physical phenomena, and electronics attached to the MEMS then process the signal information derived from the sensors. MEMS devices may be manufactured using micromachining fabrication techniques similar to those used for integrated circuits.

Audio microphones are commonly used in a variety of consumer applications such as cellular telephones, digital audio recorders, personal computers and teleconferencing systems. In a MEMS microphone, a pressure sensitive diaphragm is disposed directly onto a semiconductor die, for example. As such, the microphone is formed as a MEMS die using microfabrication techniques, rather than being fabricated from individual discrete parts.

MEMS devices may be formed as oscillators, resonators, accelerometers, gyroscopes, pressure sensors, microphones, microspeakers, micro-mirrors, and other devices, and often use capacitive sensing techniques for measuring the physical phenomenon being measured. In such applications, the capacitance change of the capacitive sensor is converted into a usable voltage or current using interface circuits. In order to properly operate such capacitive sensors, the interface circuits may include biasing elements, such as a charge pump, and sensing elements, such as resistors, capacitors, and amplifiers. The design and manufacture of the interface circuit introduces numerous characteristics to the capacitive sensor behavior. Thus, there exists opportunity for novel or improved interface circuit elements for application to transducers or other capacitive circuits.

SUMMARY

According to an embodiment, a circuit includes a high-Ω resistor including a plurality of semiconductor junction devices coupled in series and a plurality of additional capacitances formed in parallel with the plurality of semiconductor junction devices. Each semiconductor junction device of the plurality of semiconductor junction devices includes a parasitic doped well capacitance configured to insert a parasitic zero in a noise transfer function of the high-Ω resistor. Each additional capacitance of the plurality of additional capacitances is configured to adjust a parasitic pole in the noise transfer function of the high-Ω resistor in order to compensate for the parasitic zero.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 illustrates a waveform diagram of resistance plots for embodiment high-Ω bias resistors;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
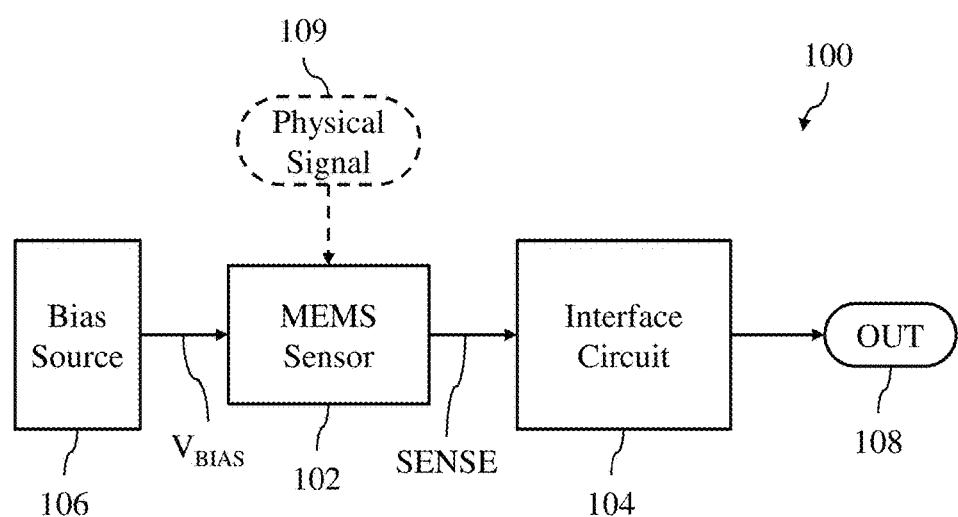
FIG. 1 illustrates a system block diagram of an embodiment MEMS sensor system.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely microphone transducers, and more particularly, MEMS microphones. Some of the various embodiments described herein include MEMS transducer systems, MEMS microphone systems, interface circuits for transducer and MEMS transducer systems, interface circuits including biasing elements, and high-Ω biasing resistors. In other embodiments, aspects may also be applied to other applications involving any type of transducer or interface circuits according to any fashion as known in the art.

Interface circuits are generally included in order to bias elements of a processing or sensing circuit and to provide readout functionality for information from the processing or sensing circuit. In particular, capacitive sensing circuits generally include circuits for biasing of the capacitive elements and readout of sensed values. According to various embodiments, capacitive sensors, and particularly MEMS capacitive sensors, including specifically MEMS capacitive microphones, include bias circuits with amplifier or buffer circuits, biasing voltage generators, such as charge pumps, and high-ohmic (high-Ω) resistors. In various such embodiment systems, the elements may be produced in an integrated circuit system. For example, the MEMS capacitive sensor, such as a MEMS capacitive microphone, may be formed on a first microfabricated die and the interface circuits including the high-Ω resistor and the biasing voltage generator may be formed on a second integrated circuit (IC) die. In another example embodiment, the MEMS capacitive sensor and the interface circuits are formed on a monolithic IC. In both such embodiments, the high-Ω resistor is formed of integrated elements and is not a discrete resistor. Further, the high-Ω resistor may have resistance values on the order of gigaohms (GΩ) or even as high as teraohms (TΩ) in some situations. In such various embodiments, integrated elements including semiconductor junctions, such as diodes and transistors, may be used to implement the high-Ω resistor.

According to various embodiments described herein, a high-Ω resistor includes multiple integrated devices, such as diodes or transistors, formed in a semiconductor substrate. In order to provide larger signal swings, the multiple integrated devices are connected in series between a first resistor node and a second resistor node, and local bulk connections are provided for the multiple integrated devices. Further, each of the multiple integrated devices includes a first parasitic capacitance that is formed intrinsically between each of the multiple devices due to the local bulk connection and a fixed reference voltage. For example, doped wells, such as the n-well or p-well, with the substrate and the body contact for a transistor used to implement each of the multiple integrated devices produce at least a portion of the first parasitic capacitance. According to various embodiments, the high-Ω resistor further includes a plurality of additional parasitic capacitances formed in parallel with the multiple integrated devices. According to such various embodiments described herein, each of the multiple integrated devices includes a second parasitic capacitance formed in parallel with the respective device as an additional capacitance. The plurality of additional parasitic capacitances are implemented in order to adjust the transfer function of the system with the high-Ω resistor and to improve the signal-to-noise ratio (SNR). Specifically, the plurality of additional parasitic capacitances are configured to arrange a parasitic pole in the transfer function in order to compensate for a parasitic zero introduced by the first parasitic capacitances of the multiple integrated devices. Various embodiment, systems, applications, implementations, and models are described further hereinafter in order to illustrate some of the various embodiments.

FIG. 1 illustrates a system block diagram of an embodiment MEMS sensor system 100 including MEMS sensor 102, interface circuit 104, and bias source 106. According to various embodiments, MEMS sensor 102 is biased by bias voltage VBIAS, receives physical signal 109, and generates sensed signal SENSE. MEMS sensor 102 may be a MEMS capacitive sensor, such as a MEMS capacitive microphone. In alternative embodiments, MEMS sensor 102 is any type of capacitive circuit.

In various embodiments, interface circuit 104 receives sensed signal SENSE from MEMS sensor 102 and generates output signal 108. In such embodiments, sensed signal SENSE may be an analog or continuous time signal generated through a transduction mechanism in MEMS sensor 102. Specifically, physical signal 109, which may be a pressure or sound wave, for example, produces a corresponding variation of the capacitance in MEMS sensor 102, such as through deflection of one or more capacitive electrodes, which produces a current or voltage signal output of MEMS sensor 102 as sensed signal SENSE. Interface circuit 104 receives sensed signal SENSE and buffers or amplifies the signal while maintaining biasing of MEMS sensor 102. Thus, as described briefly hereinabove, interface circuit 104 may include a high-Ω resistor and a buffer or amplifier. Further, in order to maintain the biased operation of MEMS sensor 102, bias source 106 generates bias voltage VBIAS to supply MEMS sensor 102.

According to various embodiments, MEMS sensor 102, interface circuit 104, and bias source 106 are formed on two separate semiconductor dies. In particular embodiments, MEMS sensor 102 is formed on a first die, e.g., a MEMS die, and bias source 106 and interface circuit 104 are formed on a second die, e.g., an application specific integrated circuit (ASIC) die. In such embodiments, the first die and the second die may be bonded together, such as through flip-chip bonding, for example. In another embodiment, MEMS sensor 102, interface circuit 104, and bias source 106 are monolithically integrated in a single semiconductor die. Thus, in various embodiments, MEMS sensor 102, interface circuit 104, and bias source 106 include elements that are compatible with semiconductor fabrication techniques.

Figure 2A:
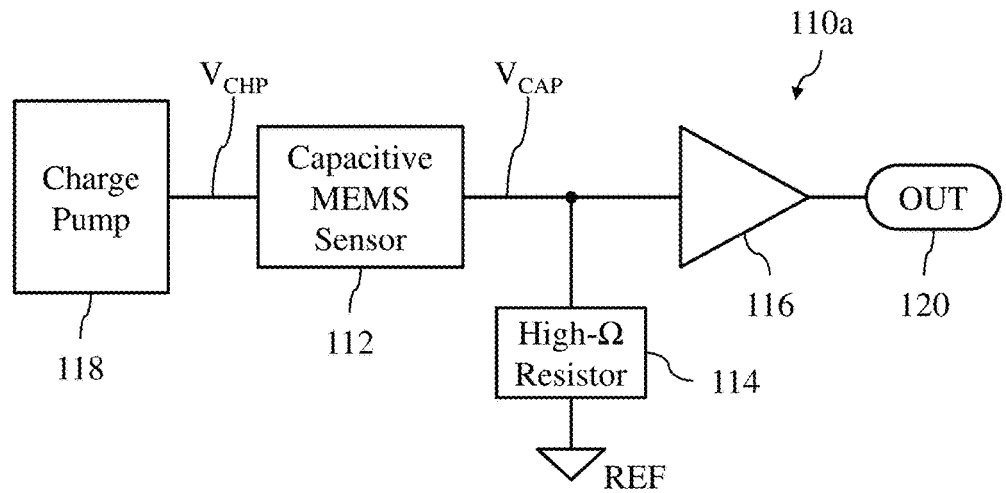
FIGS. 2A and 2B illustrate schematic block diagrams of embodiment MEMS sensor systems.
Figure 2B:
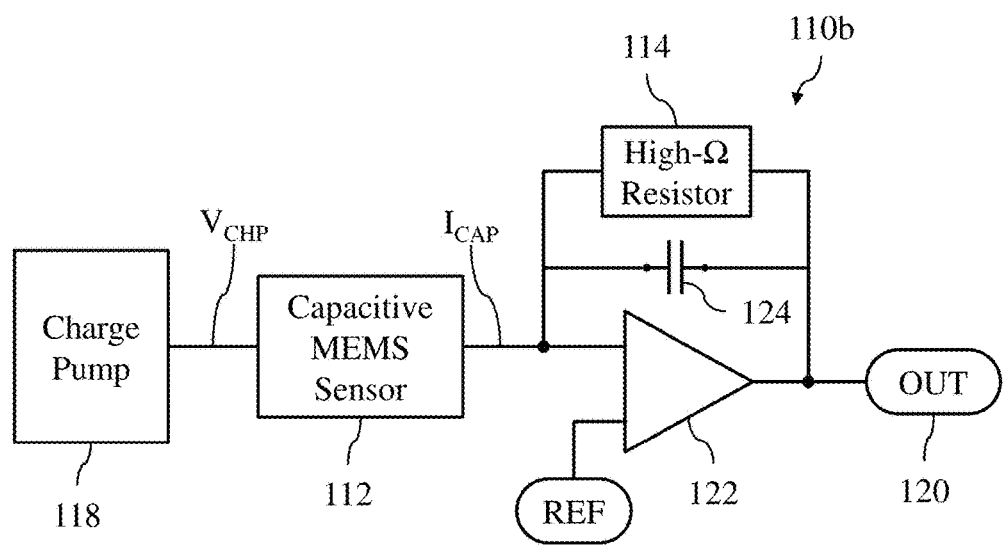

FIGS. 2A and 2B illustrate schematic block diagrams of embodiment MEMS sensor systems. FIG. 2A illustrates MEMS sensor system 110a including capacitive MEMS sensor 112, high-Ω resistor 114, amplifier 116, and charge pump 118. According to various embodiments, MEMS sensor system 110a is an embodiment implementation of MEMS sensor system 100 as described hereinabove in reference to FIG. 1 and includes a constant charge interface. Charge pump 118 biases capacitive MEMS sensor 112 by generating and supplying charge pump voltage VCHP to capacitive MEMS sensor 112. Based on physical input signals, as described hereinabove in reference to physical signal 109 in FIG. 1, capacitive MEMS sensor 112 generates transduced voltage VCAP. High-Ω resistor 114 maintains the charge level on capacitive MEMS sensor 112 while amplifier 116 receives transduced voltage VCAP. In some embodiments, amplifier 116 operates as a buffer and does not provide amplification, i.e., has a gain of 1. In other embodiments, amplifier 116 provides amplification. Based on transduced voltage VCHP, amplifier 116 drives output signal 120. In various embodiments, high-Ω resistor 114 provides a high resistance path to reference voltage REF to bias the input of the amplifier. In various embodiments, amplifier 116 is a single-input, single-output amplifier.

FIG. 2B illustrates MEMS sensor system 110b including capacitive MEMS sensor 112, high-Ω resistor 114, amplifier 122, charge pump 118, and capacitor 124. According to various embodiments, MEMS sensor system 110b is another embodiment implementation of MEMS sensor system 100 as described hereinabove in reference to FIG. 1 and includes a constant voltage interface. MEMS sensor system 110b includes similar elements as described in reference to MEMS sensor system 110a. Description of commonly numbered elements applies to all instances of the commonly number elements and will not be repeated in the interest of brevity.

In various embodiments, capacitive MEMS sensor 112 generates transduced current ICAP based on physical input signals, such as physical signal 109. Amplifier 122 receives transduced current ICAP from capacitive MEMS sensor 112 and generates output signal 120. As described in reference to amplifier 116, amplifier 122 may operate as a buffer with no amplification or may provide amplification in various different embodiments. In various embodiments, high-Ω resistor 114 and capacitor 124 maintain the voltage level on capacitive MEMS sensor 112. In various embodiments, amplifier 122 is a differential-input, single-output amplifier.

In such embodiments, the negative polarity input of amplifier 122 may be coupled to capacitive MEMS sensor 112 and the positive polarity input of amplifier 122 may be coupled to reference voltage REF.

According to various embodiments, high-Ω resistor 114 maintains the biasing of capacitive MEMS sensor 112, as described in reference to MEMS sensor system 110a and MEMS sensor system 110b in FIGS. 2A and 2B. In such embodiments, high-Ω resistor 114 may have a resistance value in the GΩ or TΩ range. In order to implement such a high resistance value in an integrated semiconductor die, high-Ω resistor 114 may be implemented using semiconductor device structures including semiconductor junctions, such as integrated diode structures or transistor structures.

Figure 3:
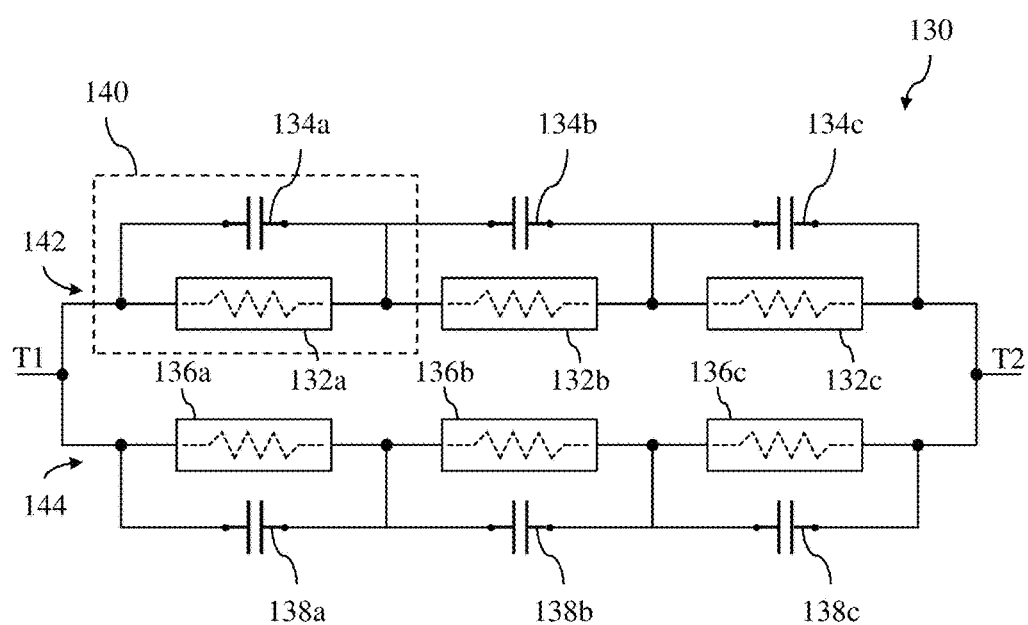
FIG. 3 illustrates a schematic diagram of an embodiment high-Ω bias resistor.

FIG. 3 illustrates a schematic diagram of an embodiment high-Ω bias resistor 130, which may be an embodiment implementation of high-Ω resistor 114 as described hereinabove in reference to FIGS. 2A and 2B. According to various embodiments, high-Ω bias resistor 130 includes semiconductor resistive elements 132a, 132b, and 132c, additional parasitic capacitances 134a, 134b, and 134c, semiconductor resistive elements 136a, 136b, and 136c, and additional parasitic capacitances 138a, 138b, 138c. In such embodiments, semiconductor resistive elements 132a, 132b, and 132c form series resistance 142 between terminal T1 and terminal T2 of high-Ω bias resistor 130. Similarly, semiconductor resistive elements 136a, 136b, and 136c form series resistance 144 between terminal T1 and terminal T2.

In various embodiments, semiconductor resistive elements 132a, 132b, and 132c and semiconductor resistive elements 136a, 136b, and 136c are implemented as transistors or diodes. For example, semiconductor resistive elements 132a, 132b, and 132c and semiconductor resistive elements 136a, 136b, and 136c are implemented using metal oxide semiconductor field effect transistor (MOSFET) structures in some embodiments. In various embodiments, semiconductor resistive elements 132a, 132b, and 132c are connected in series and semiconductor resistive elements 136a, 136b, and 136c are connected in series in order to produce a large signal response that corresponds to a desired resistance. In some embodiments, the response of each of the semiconductor resistive elements is asymmetric due to the connections of the transistor structure for implementing a resistance, as will be described further hereinafter in reference to additional embodiments. Thus, series resistance 142 and series resistance 144 are formed in antiparallel in order to produce symmetric, or approximately symmetric, behavior of high-Ω bias resistor 130 between terminal T1 and terminal T2. That is, series resistance 142 and series resistance 144 are coupled in parallel between terminal T1 and terminal T2, but one of the series paths, such as series resistance 142 for example, provides a resistance that increases with the voltage difference between terminal T2 and terminal T1 while the other of the series paths, such as series resistance 144 for example, provides a resistance that increases with the voltage difference between terminal T1 and terminal T2.

In various embodiments, semiconductor resistive elements 132a, 132b, and 132c and semiconductor resistive elements 136a, 136b, and 136c all include intrinsic parasitic capacitances. The intrinsic parasitic capacitances introduced by semiconductor resistive elements 132a, 132b, and 132c and semiconductor resistive elements 136a, 136b, and 136c may, at some frequencies, provide a short circuit path around the corresponding resistive components of semiconductor resistive elements 132a, 132b, and 132c and semiconductor resistive elements 136a, 136b, and 136c and lower the intended resistance of high-Ω bias resistor 130. As the intended resistance of high-Ω bias resistor 130 decreases, the noise introduced into the capacitive sensing system, such as MEMS sensor system 100 in FIG. 1, for example, increases. Specifically, the intrinsic parasitic capacitances introduce parasitic poles and zeros in the transfer function of the noise of high-Ω bias resistor 130 of the capacitive sensing system, increasing the power spectral density of the noise voltage at the input of a MEMS sensor system, such as MEMS sensor system 110a as described hereinabove in reference to FIG. 2A. Thus, in various embodiments, in order to address the noise increase, additional parasitic capacitances 134a, 134b, and 134c and additional parasitic capacitances 138a, 138b, 138c are included in parallel in order to reduce the effect of a parasitic zero with a parasitic pole introduced by the intrinsic parasitic capacitances. In such embodiments, each additional parasitic capacitance is respectively connected in parallel with a semiconductor resistive element (as shown). Further description of the transfer functions in view of the intrinsic parasitic capacitances and the additional parasitic capacitances is provided hereinafter in order to further convey aspects of various embodiments. Further, specific embodiment implementations of various devices including additional parasitic capacitances are also described hereinafter.

According to various embodiments, high-Ω bias resistor 130 includes any number of resistive cells 140 in series and parallel. Each resistive cell 140 includes a semiconductor resistive element, such as semiconductor resistive element 132a and an additional parasitic capacitance, such as additional parasitic capacitance 134a, coupled in parallel. In such embodiments, the intrinsic parasitic capacitance of the semiconductor element is not illustrated. According to the embodiment illustrated in FIG. 3, high-Ω bias resistor 130 includes two parallel (or antiparallel, as described hereinabove in reference to series resistance 142 and series resistance 144) paths of three resistive cells 140 for each path. In other embodiments, 1, 2, 3, 4, 5, or more resistive cells may be coupled in series and 1 or more such series paths of resistive cells 140 may be coupled in parallel. According to one specific embodiment, high-Ω bias resistor 130 includes two series paths coupled in parallel, where each series path has four resistive cells 140 coupled in series.

Figure 4A:
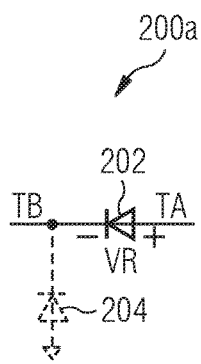
FIGS. 4A, 4B, 4C, and 4D illustrate schematic diagrams of devices and a model for implementation in embodiment high-Ω bias resistors.

FIGS. 4A, 4B, 4C, and 4D illustrate schematic diagrams of devices and a model for implementation in embodiment high-Ω bias resistors. FIG. 4A illustrates device 200a including diode 202. According to various embodiments, biased diodes, such as diode 202, may generate a high-Ω resistance for specific voltage ranges. Specifically, diode 202 provides a path from node TA to node TB that includes resistive voltage VR (VR=VTA−VTB) across diode 202, which acts as the resistive element. In such embodiments, when resistive voltage VR is small, such as less than the forward voltage of diode 202, the equivalent resistance of diode 202 may be large, such as greater than 100 GΩ. When the resistive voltage VR is large, such as above the forward voltage of diode 202, the equivalent resistance of diode 202 may quickly decrease and approach zero. When resistive voltage VR is negative, the equivalent resistance of diode 202 is very large (and increases as resistive voltage VR become more negative until breakdown operation). Thus, the equivalent resistance of diode 202 is asymmetric and may be insufficient for voltages above the forward voltage of diode 202. In such various embodiments, parasitic diode 204 is indicated forming a reverse diode connection from node TB to ground node GND. Parasitic diode 204 illustrates the parasitic diode formed between the junction of the doped well region, e.g., the n-well, and the substrate bulk. In various embodiments, diode 202 may be implemented as a physical diode or as a diode connected transistor.

Figure 4B:
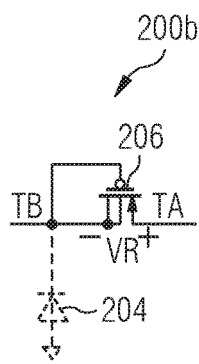

FIG. 4B illustrates device 200b including diode connected transistor 206. In such embodiments, diode connected transistor 206 operates as similarly described hereinabove in reference to diode 202 in FIG. 4A. In various embodiments, diode connected transistor 206 is implemented as a transistor, such as a MOSFET, connected from node TA to node TB and having the gate, drain, and body contacts coupled together.

Figure 4C:
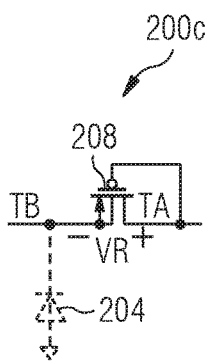

FIG. 4C illustrates device 200c including diode connected transistor 208. In such embodiments, diode connected transistor 208 operates as similarly described hereinabove in reference to diode 202 in FIG. 4A and is connected so as to provide a forward directed diode path from node TB to node TA. Further, diode connected transistor 208 includes a short between the body contact and the source, whereas diode connected transistor 206 includes a short between the body contact and the drain.

Figure 4D:
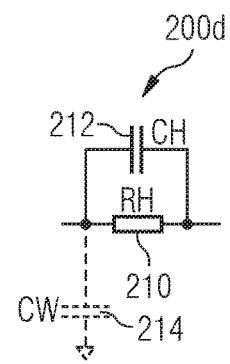

FIG. 4D illustrates device model 200d including equivalent resistance 210, device parasitic capacitance 212, and well capacitance 214. In such embodiments, equivalent resistance 210 models the equivalent resistance of the specific device, i.e., diode 202, diode connected transistor 206, or diode connected transistor 208 and has resistance RH. Device parasitic capacitance 212 models the equivalent parasitic capacitance in parallel with the specific device, i.e., diode 202, diode connected transistor 206, or diode connected transistor 208 and has capacitance CH. Specifically, capacitance CH may be approximated as the sum of the overlap capacitance and the gate-bulk capacitance for the corresponding MOSFET structure for diode connected transistor 208. However, in the case of diode connected transistor 206, the gate-bulk capacitance is shorted by the bulk and gate connections to node TB. Thus, capacitance CH for diode connected transistor 206 may be approximated as just the overlap capacitance for the corresponding MOSFET structure. Finally, well capacitance 214 models the equivalent parasitic capacitance between the junction of the doped well region, e.g., the n-well, and the substrate bulk and has capacitance CW, which corresponds to parasitic diode 204.

According to various embodiments, diode 202, diode connected transistor 206, or diode connected transistor 208 may be connected in series or in parallel, as similarly described hereinabove in reference to high-Ω bias resistor 130 and resistive cells 140 in FIG. 3. In various applications, well capacitance 214 introduces a parasitic zero in the transfer functions of high-Ω bias resistors implemented with transistor or diodes. Thus, according to various embodiments described herein, additional parasitic capacitances are added to the elements, such as diode 202, diode connected transistor 206, or diode connected transistor 208, in order to adjust a parasitic pole to compensate for the parasitic zero introduced by well capacitance 214.

Figure 5A:
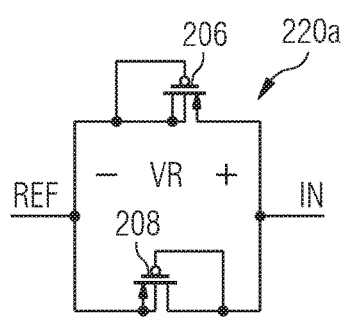
FIGS. 5A and 5B illustrate schematic diagrams of further embodiment high-Ω bias resistors.
Figure 5B:
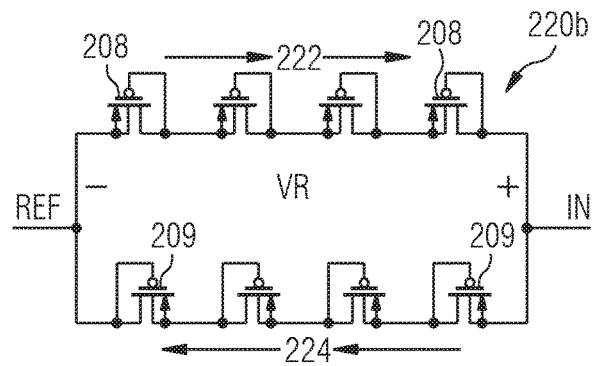

FIGS. 5A and 5B illustrate schematic diagrams of further embodiment high-Ω bias resistors. FIG. 5A illustrates high-Ω bias resistor 220a including diode connected transistor 206 and diode connected transistor 208 coupled in parallel. More specifically, in such embodiments, diode connected transistor 206 and diode connected transistor 208 are coupled in antiparallel with diode connected transistor 206 providing a forward directed diode path from input node IN to reference node REF and diode connected transistor 208 providing a forward directed diode path from reference node REF to input node IN. According to various embodiments, the equivalent resistance between input node IN and reference node REF is symmetric, or approximately symmetric, when diode connected transistor 206 and diode connected transistor 208 are connected in parallel.

FIG. 5B illustrates high-Ω bias resistor 220b including four instances of diode connected transistor 208 coupled in series and four instances of diode connected transistor 209 coupled in series. In various embodiments, diode connected transistor 209 is identical to diode connected transistor 208, but is connected with the opposite polarity. According to various embodiments, the four instances of diode connected transistor 208 are couple in series to form series path 222, which provides forward directed diode paths from reference node REF to input node IN. The four instances of diode connected transistor 209 are coupled in series to form series path 224, which provides forward directed diode paths from input node IN to reference node REF. In such embodiments, series path 222 and series path 224 are coupled in antiparallel to provide symmetric, or approximately symmetric, operation of the equivalent resistance for high-Ω bias resistor 220b.

Further, coupling four instances of diode connected transistor 209 and four instances of diode connected transistor 208 in series increases the voltage range for high-Ω bias resistor 220b compared to a single diode connected transistor. In such embodiments, equivalent resistance may be large for voltage differences between input node IN and reference node REF greater than the forward voltage of diode connected transistor 208 or diode connected transistor 209 because each respective diode will not be forward biased until the voltage difference between input node IN and reference node REF reaches the four times the forward voltage. Thus, in such embodiments, the operating voltage between input node IN and reference node REF for high-Ω bias resistor 220b may increase, providing for larger signal swings, compared to resistors with a single diode connected transistor forming a series path between input node IN and reference node REF.

In various other embodiments, any number of diode connected transistors 208 or diode connected transistors 206 may be coupled in series with various different polarities. Whereas four of each type of device is shown coupled in series to form series path 222 and series path 224, the number of each type of device for series path 222 or series path 224 may range from 1 to 10, or more, in various different embodiments. In some particular embodiments, series path 222 and series path 224 include different numbers of devices, such as an even number, for example, of diode connected transistors 208 or diode connected transistors 206 in series path 222 and an odd number, for example, of diode connected transistors 208 or diode connected transistors 206 in series path 224.

FIG. 6 illustrates a waveform diagram of resistance plots 230, 232, and 234 for embodiment high-Ω bias resistors. Resistance plot 230 illustrates the equivalent resistance of device 200b as described hereinabove in reference to FIG. 4B. Resistance plot 232 illustrates the equivalent resistance of high-Ω bias resistor 220a as described hereinabove in reference to FIG. 5A. Resistance plot 234 illustrates the equivalent resistance of high-Ω bias resistor 220b as described hereinabove in reference to FIG. 5B. As described hereinabove, the symmetry of the equivalent resistance and the range for resistive voltage VR varies for various different embodiments.

Figure 7A:
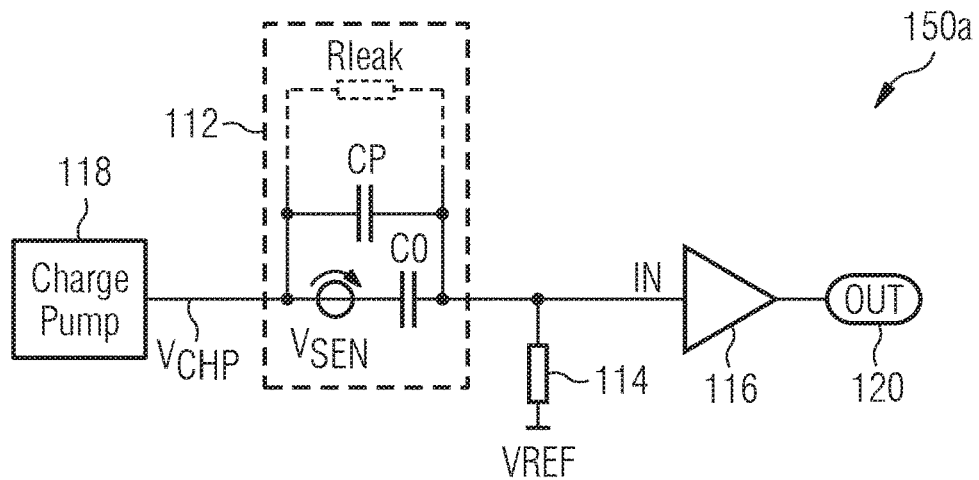
FIGS. 7A and 7B illustrate schematic diagrams of modeled embodiment MEMS sensor systems.
Figure 7B:
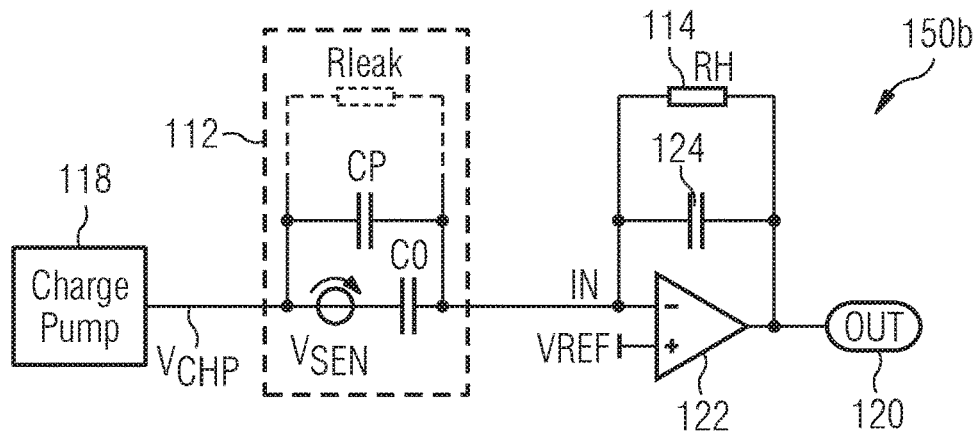

FIGS. 7A and 7B illustrate schematic diagrams of modeled embodiment MEMS sensor system 150a and MEMS sensor system 150b, respectively, corresponding to MEMS sensor system 110a and MEMS sensor system 110b in FIGS.

2A and 2B, respectively. Capacitive MEMS sensor 112 may be modeled by sensor voltage VSEN, main capacitance C0, parasitic capacitance CP, and leakage resistance Rleak, as shown in FIGS. 7A and 7B. Thus, main capacitance C0 is the capacitance of the capacitive MEMS sensor and provides the primary behavior of the system. Further, the non-idealities of high-Ω resistor 114 or the presence of leakage resistance Rleak and parasitic capacitance CP affect the behavior of the system.

Figure 8:
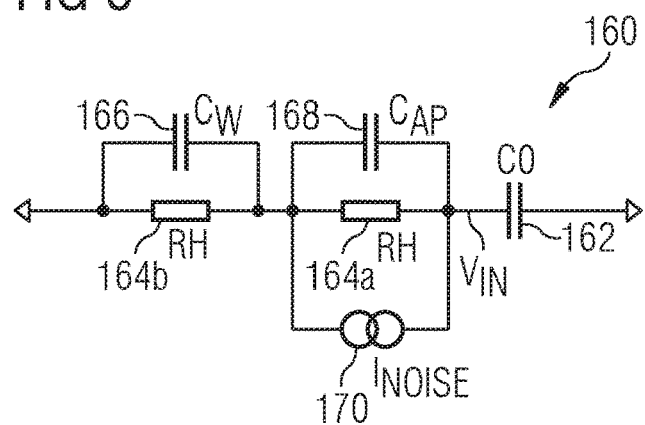
FIG. 8 illustrates an equivalent model of an embodiment high-Ω bias resistor.

FIG. 8 illustrates an equivalent model 160 of high-Ω resistor 114 coupled to capacitance C0 of capacitive MEMS sensor 112. According to various embodiments, equivalent model 160 is a simplified model for thermal noise associated with two devices coupled in series, such as diode connected transistors, of a high-Ω bias resistor in a capacitive MEMS sensor system, such as described hereinabove in reference to FIGS. 3, 4A, 4B, 4C, 4D, 5A, and 5B, for example. Thus, for purposes of the simplified model for thermal noise associated with the single device, equivalent model 160 includes main sensor capacitor 162, first high-Ω resistor 164a, second high-Ω resistor 164b, well capacitance 166, additional parasitic capacitance 168, and noise current source 170.

For the illustrated model, noise current source 170 represents the thermal noise of a single resistor, first high-Ω resistor 164a, while second high-Ω resistor 164b is included in series for modeling the effect of series connected resistors and the role of parasitic capacitances. Well capacitance 166 models the parasitic capacitance formed between the doped well of the device, e.g., MOSFET structure, and the substrate bulk. Additional parasitic capacitance 168 models the additional parasitic capacitance coupled in parallel with first high-Ω resistor 164a. In various embodiments, additional parasitic capacitance 168 may include the intrinsic capacitance of the MOSFET structure, including the overlap capacitance or the gate-bulk capacitance, and additional parasitic capacitance structures formed in the substrate with each MOSFET structure as is described further hereinafter. Well capacitance 166 has capacitance CW, additional parasitic capacitance 168 has capacitance CAP, first high-Ω resistor 164a and second high-Ω resistor 164b have resistance RH, and main sensor capacitor 162 has capacitance C0.

Figure 9A:
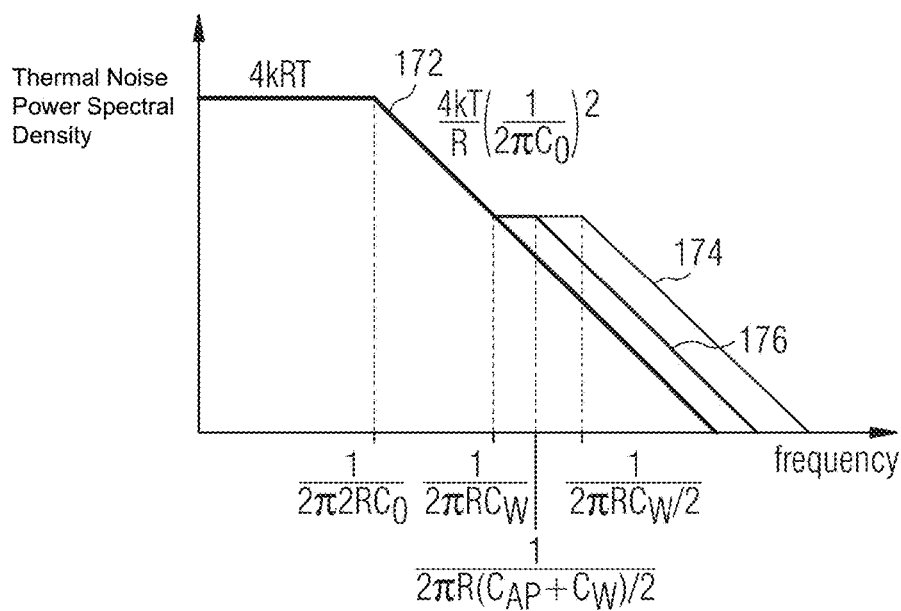
FIGS. 9A and 9B illustrate Bode plots of power spectral density plots for the equivalent model of FIG. 8.
Figure 9B:
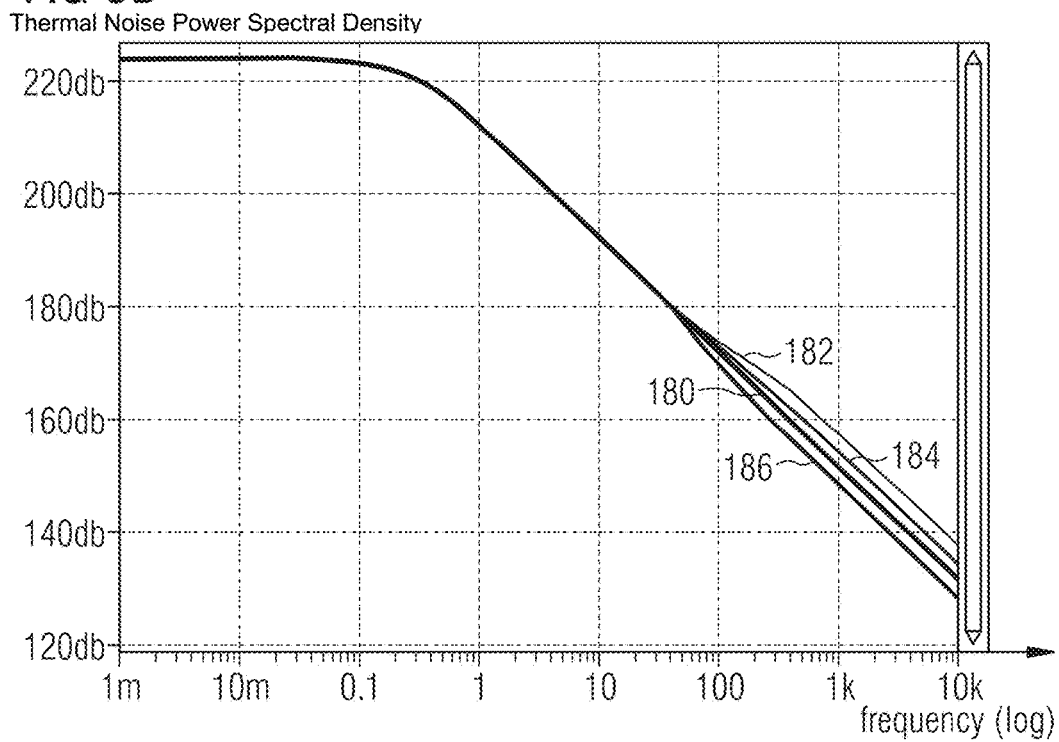

FIGS. 9A and 9B illustrate Bode plots of power spectral density plots of equivalent model 160. The following description makes reference to FIGS. 8, 9A, and 9B in order to further understanding. As a first step in analyzing equivalent model 160, capacitance CW and capacitance CAP are set to zero. In such cases, input voltage VIN may be given by the expression $$V_{IN} = I_{NOISE} \cdot \left( \frac{R_H}{1 + s2R_H C_0} \right).$$

In such cases, capacitance C0 produces a pole at $1/(2\pi 2 \cdot RH \cdot C0)$ in the power spectral density of the thermal noise. The pole is set at a frequency lower than the signal bandwidth; therefore the power spectral density of the thermal noise in the signal bandwidth has the expression $$V_{NOISE}^2 = \frac{4kT}{R_H} \left( \frac{1}{2} \frac{1}{2\pi f C_0} \right)^2,$$

as shown by plot 172 in FIG. 9A.

As a second step in analyzing equivalent model 160, capacitance CW of well capacitance 166 is set to be non-zero. In such cases, the expression for input voltage VIN can be approximated with the following formula, assuming C0>>CW, $$V_{IN} = I_{NOISE} \cdot \left( \frac{R_H(1 + sR_H C_W)}{(1 + s2R_H C_0)\left(1 + s\frac{R_H C_W}{2}\right)} \right),$$

where capacitance CW introduces a zero at $1/(2\pi \cdot RH \cdot CW)$ and a second pole at $1/(2\pi \cdot RH \cdot CW \cdot \frac{1}{2})$, as shown by plot 174 in FIG. 9A. Thus, the added pole, as a result of well capacitance 166, extends the roll off of the thermal noise to higher frequencies and results in additional thermal noise being included or in a decrease in SNR.

As a third step in analyzing equivalent model 160, capacitance CAP of additional parasitic capacitance 168 is also set to be non-zero. In such cases, the expression for input voltage VIN is approximated as follows $$V_{IN} = I_{NOISE} \cdot \left( \frac{R_H(1 + sR_H C_W)}{(1 + s2R_H C_0)\left(1 + s\frac{R_H(C_{AP} + C_W)}{2}\right)} \right),$$

where capacitance CAP has shifted the second pole to $1/(2\pi \cdot RH \cdot (CAP+CW) \cdot \frac{1}{2})$, as shown by plot 176 in FIG. 9A. In such embodiments, capacitance CAP, which includes the device structure, e.g., MOSFET structure, parasitic capacitance and additional capacitance formed in parallel with the device structure, is able to adjust the location of the second pole. By adjusting the location of the second pole to be closer to the location of the zero, it is possible to compensate for or reduce the effects of well capacitance 166 (with capacitance CW) using additional parasitic capacitance 168 (with capacitance CAP). Thus, the extension of the roll off of the thermal noise to higher frequencies, due to well capacitance 166, is prevented or limited and less thermal noise is included, which may produce an increased SNR.

According to various embodiments, capacitance CAP, for additional parasitic capacitance 168, is selected to shift and compensate for the parasitic effects of well capacitance 166. This is illustrated in FIG. 9B as capacitance CAP is swept from zero to a compensating value. Specifically, plot 180 illustrates the Bode plot of the power spectral density of the thermal noise when capacitance CW and capacitance CAP are zero, plot 182 illustrates the Bode plot of the power spectral density of the thermal noise when capacitance CW is non-zero and capacitance CAP is zero, plot 184 illustrates the Bode plot of the power spectral density of the thermal noise when capacitance CW is non-zero and capacitance CAP is a first value, and plot 186 illustrates the Bode plot of the power spectral density of the thermal noise when capacitance CW is non-zero and capacitance CAP is a second value.

Figure 10A:
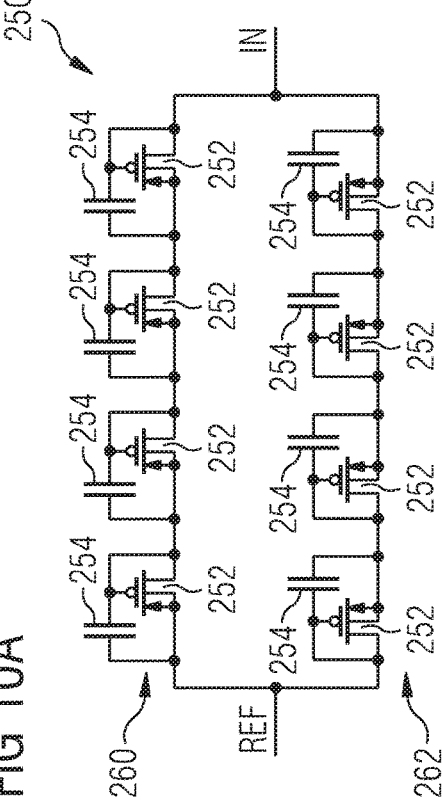
FIGS. 10A and 10B illustrate schematic diagrams of additional embodiment high-Ω bias resistors.
Figure 10B:
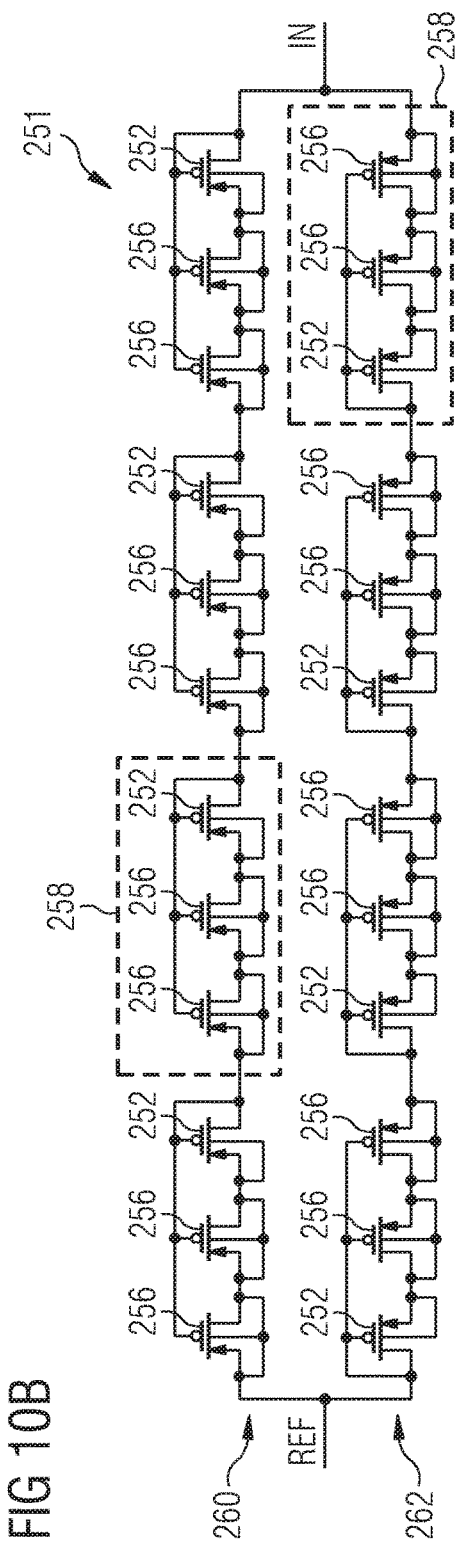

FIGS. 10A and 10B illustrate schematic diagrams of additional embodiment high-Ω bias resistor 250 and high-Ω bias resistor 251. According to various embodiments, high-Ω bias resistor 250 in FIG. 10A is an embodiment implementation of high-Ω bias resistor 220b as described hereinabove in reference to FIG. 5B, where capacitances 254 are added in parallel with each diode connected transistor 252 in order to compensate and reduce the effect of the zero added by the parasitic n-well diodes, as explained hereinabove in reference to the other figures.

According to various embodiments, capacitances 254 may be implemented as different devices. In some particular embodiments, capacitances 254 are implemented as metal capacitors, as polysilicon-polysilicon capacitor, or as MOS capacitors. In such embodiments, capacitances 254 are formed of conductive materials directly in or on the substrate of high-Ω bias resistor 250. In particular embodiments, capacitor types with high density may be used for capacitances 254 in order to maintain a small area, for example. In various embodiments, capacitances 254 are implemented in such a way that the increase of parasitic capacitance between the n-well of diode connected transistor 252 and the substrate is kept small.

According to various embodiments, high-Ω bias resistor 250 includes series path 260 and series path 262. In particular embodiments, series path 260 includes four diode connected transistors 252 along with four capacitances 254 and series path 262 includes four diode connected transistors 252 along with four capacitances 254, where series path 260 and series path 262 have opposite polarities that provide opposite forward directed current paths between input node IN and reference node REF. In other embodiments, other numbers of diode connected transistors 252 and capacitances 254 are included in series path 260 and series path 262. In further embodiments, only some diode connected transistors 252 include capacitances 254 coupled in parallel. In such embodiments, diode connected transistors 252 near input node IN or directly connected to input node IN may include capacitances 254 and diode connected transistors 252 near reference node REF or directly connected to reference node REF may omit capacitances 254. Thus, various embodiments may include diode connected transistors 252 with capacitances 254 coupled in parallel and diode connected transistors 252 without capacitances 254 coupled in parallel.

According to various embodiments, high-Ω bias resistor 251 in FIG. 10B is an embodiment implementation of high-Ω bias resistor 250 as described hereinabove in reference to FIG. 10A, where capacitances 254 are implemented using the parasitic capacitances of PMOS devices. Specifically, capacitances 254 are implemented by PMOS capacitors 256, which have source, drain and body terminals shorted together to form first capacitor terminals and gate terminals as second capacitor terminals. In such embodiments, each diode connected transistor 252 implements a part of the high-Ω resistance and is coupled in parallel with two PMOS capacitors 256.

According to various embodiments, each diode connected transistor 252 is formed in a separate n-well, such as illustrated as n-well 258. Two corresponding PMOS capacitors 256 are also formed in the same n-well 258 with diode connected transistor 252, separate from the other instances, and other corresponding n-wells 258, of diode connected transistors 252. As shown, n-well 258 is represented as the dotted line including the three devices: two PMOS capacitors 256 coupled in parallel with one diode connected transistor 252. In various embodiments, PMOS capacitors 256 may be formed close to the borders of n-well 258, in order to protect diode connected transistor 252 from stresses and variation of its threshold, which may alter its equivalent resistance. In particular embodiments, n-well 258 may be kept as small as possible in order to avoid unnecessary increases of the n-well diode of the structure. In alternative embodiments, n-well 258 may extend across multiple series elements, such as two, for example, including two instances of diode connected transistors 252 and the additional parallel capacitances, such as two instances of capacitances 254 (FIG. 10A) or two instances of one or two PMOS capacitors 256 (FIG. 10B).

In various embodiments, the gates of PMOS capacitors 256 are coupled to the gate of an adjacent diode connected transistor 252 for each series element (as shown). In alternative embodiments, the orientation of PMOS capacitors 256 may be switched so that the gates of PMOS capacitors 256 are coupled to the source, or the drain, of an adjacent diode connected transistor 252 for a series element (not shown).

According to various embodiments, high-Ω bias resistor 251 includes series path 260 and series path 262 providing opposite forward directed current paths between input node IN and reference node REF, as described hereinabove in reference to FIG. 10A.

According to various embodiments, rearrangements of diode connected transistor 252 for size, layout, and polarity are expected in different applications, as will be readily appreciated by those having skill in the art. Further, in some embodiments, capacitances 254 may be implemented to include two PMOS capacitors coupled in parallel with diode connected transistor 252, as shown, or capacitances 254 may include only one PMOS capacitor coupled in parallel with diode connected transistor 252 (not shown). Further, although the description and illustration of various embodiments is presented herein primarily in the context of p-type MOSFET (PMOS) devices, those of skill in the art will readily appreciate that n-type MOSFET (NMOS) devices may readily be used to implement the various embodiments described herein.

According to various embodiments, high-Ω bias resistor 250 and high-Ω bias resistor 251 are implementations of the various semiconductor junction devices used to implement any of the high-Ω resistors described herein. Thus, high-Ω bias resistor 250 and high-Ω bias resistor 251 may be used in the implementation of high-Ω resistor 114 as described hereinabove in reference to FIGS. 2A and 2B; high-Ω bias resistor 130 as described hereinabove in reference to FIG. 3; diode 202, diode connected transistor 206, diode connected transistor 208, or diode connected transistor 209 as described hereinabove in reference to FIGS. 4A, 4B, 4C, 5A, and 5B; and first high-Ω resistor 164a or second high-Ω resistor 164b as described hereinabove in reference to FIG. 8. Further, in some embodiments, a single instance of diode connected transistor 252 and capacitance 254 is an embodiment implementation of a single instance of resistive cells 140 as described hereinabove in reference to FIG. 3.

In various embodiments, the materials and processes used to form diode connected transistor 252, capacitances 254, or PMOS capacitors 256 may vary depending on the fabrication process selected in different applications and environment, as will be readily appreciated by those having skill in the art. Thus, the metal and conductive layers, such as for capacitances 254, for example, may be formed of various metals or other conductive materials as are commonly known in the art. For example, such conductive materials or metals may include polysilicon, doped polysilicon, doped single crystalline silicon, aluminum, copper, gold, platinum, and other semiconductor or doped semiconductor materials. Further, the various fabrication steps and sequences used, such as the deposition and patterning of layers for the formation of the various layers or vias, may be known to those having skill in the art and is not described herein in the interest of brevity.

Figure 11A:
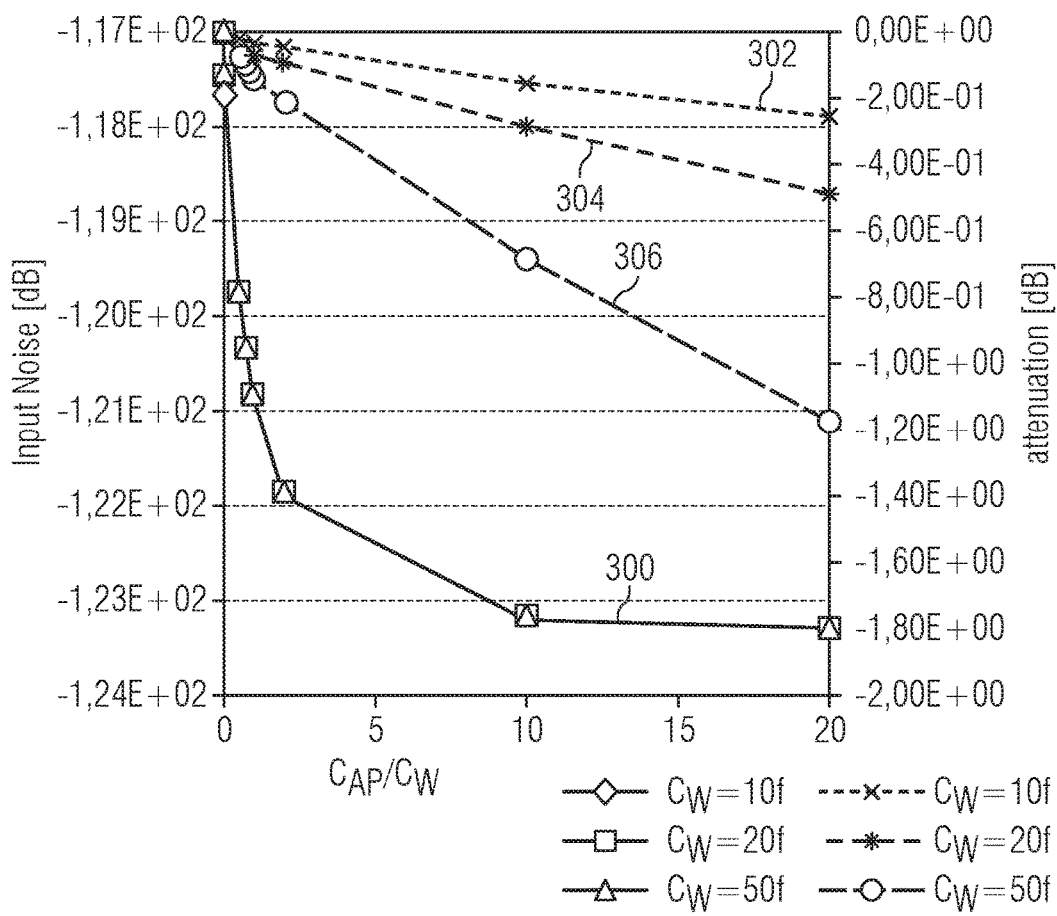
FIGS. 11A and 11B illustrate a waveform diagram of input noise and attenuation plots along with an equivalent model for various embodiments.
Figure 11B:
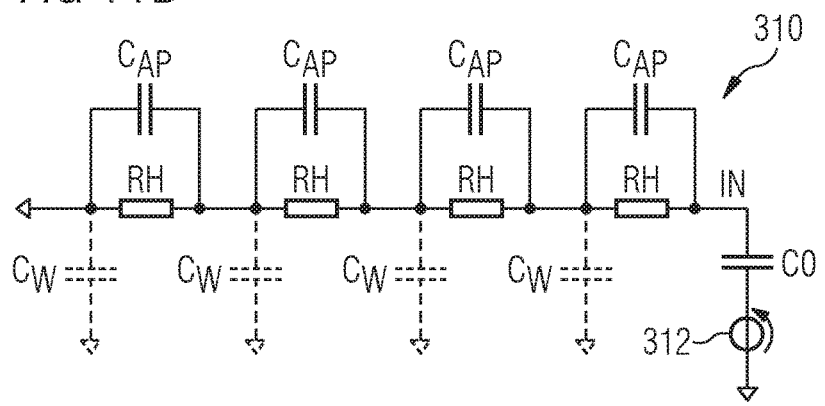

FIGS. 11A and 11B illustrate a waveform diagram of input noise and attenuation plots for various embodiments, including noise plot 300 and attenuation plots 302, 304, and 306, along with equivalent model 310. In various embodiments, as described hereinabove in reference to the other figures, additional parasitic capacitances, with capacitance CAP, are included in parallel with resistive elements for embodiment high-Ω resistors RH in order to compensate for parasitic influences, e.g., parasitic zeros, introduced by the parasitic well capacitances, with capacitance CW.

Equivalent model 310, which may be a model of high-Ω resistor 114 in MEMS sensor system 110a or MEMS sensor system 110b as described hereinabove in reference to FIGS. 2A and 2B, illustrates input voltage source 312 (which may represent the signal voltage on a capacitive MEMS sensor) and main capacitance C0 coupled to input node IN, where noise is transferred to the system. In analyzing equivalent model 310, if high-Ω resistors RH are the dominant noise source, increasing the ratio of capacitances CAP/CW improves the SNR. On the other hand, when the ratio of capacitances CAP/CW is increased above a certain value, the signal attenuation from voltage source 312 to input node IN will increase and the noise of an amplifier coupled to input node IN, such as amplifier 116 in FIG. 2A, may begin to dominate. By considering both issues, the ratio of capacitances CAP/CW may be selected for improved SNR. This is shown by noise plot 300 and attenuation plots 302, 304, and 306 in FIG. 11A.

As shown by noise plot 300, which includes overlapping plots for three different values of capacitance CW as shown, the input noise, contributed by the bias resistances RH and transferred on the input signal generator 312, decreases quickly for an increasing ratio of capacitances CAP/CW (the x-axis of the plot) and then levels out around a ratio of CAP/CW of about 10. Thus, in various embodiments, the decrease in input noise may be most significant for adding capacitance CAP (the added parallel capacitance) up to about 10 times capacitance CW (the well capacitance). In such embodiments, the attenuation, as shown by attenuation plots 302 (for capacitance CW of 10 fF), 304 (for capacitance CW of 20 fF), and 306 (for capacitance CW of 50 fF), continues to increase linearly for an increasing ratio of CAP/CW. If both the noise of the amplifier connected to the input node IN and the resistors RH are considered and transferred on the input signal generator 312, an optimum value for capacitance CAP can be found, which minimizes the total input referred noise.

Figure 12:
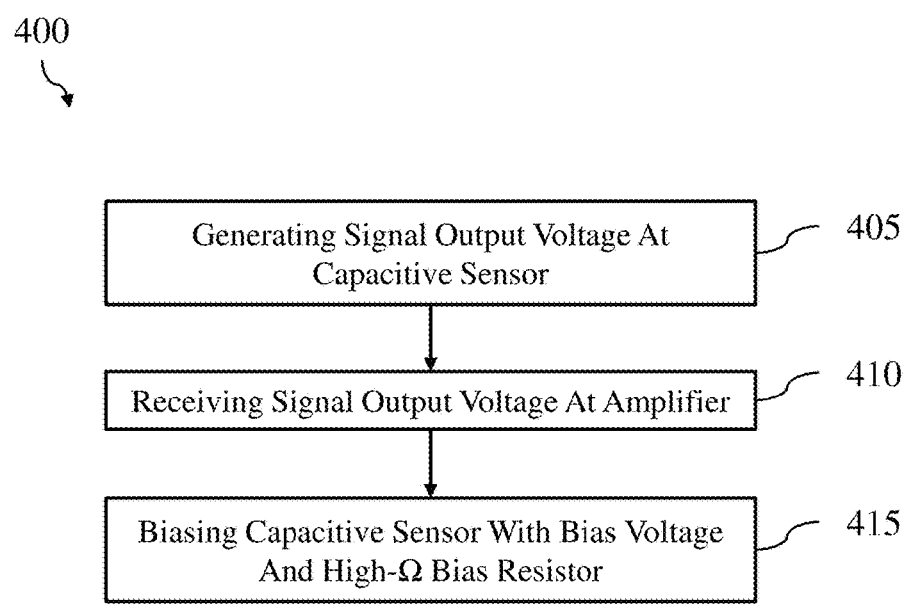
FIG. 12 illustrate a flowchart diagram of an embodiment method of operation.

FIG. 12 illustrate a flowchart diagram of an embodiment method of operation 400 including steps 405, 410, and 415. According to various embodiments, method of operation 400 is a method of operating a sensing circuit. Step 405 includes generating a signal output voltage at a capacitive sensor. For example, the capacitive sensor is a MEMS capacitive microphone. Step 410 includes receiving the signal output voltage at an amplifier. The amplifier may be a buffer without signal gain or may include signal gain.

In various embodiments, step 415 includes biasing the capacitive sensor with a bias voltage and a high-Ω bias resistor. In such embodiments, the high-Ω bias resistor includes a plurality of resistive cells coupled in series. Each resistive cell of the plurality of resistive cells may include a semiconductor junction device with a parasitic doped well capacitance configured to insert a parasitic zero in a noise transfer function of the high-Ω bias resistor. Further, each resistive cell may also include an additional capacitance configured to adjust a parasitic pole in the noise transfer function of the high-Ω bias resistor in order to compensate for the parasitic zero. The high-Ω bias resistor may include any of the embodiments described hereinabove in reference to the other figures. In some embodiments, method of operation 400 may include additional steps and may be rearranged in different sequences for various applications.

According to an embodiment, a circuit includes a high-Ω resistor including a plurality of semiconductor junction devices coupled in series and a plurality of additional capacitances formed in parallel with the plurality of semiconductor junction devices. Each semiconductor junction device of the plurality of semiconductor junction devices includes a parasitic doped well capacitance configured to insert a parasitic zero in a noise transfer function of the high-Ω resistor. Each additional capacitance of the plurality of additional capacitances is configured to adjust a parasitic pole in the noise transfer function of the high-Ω resistor in order to compensate for the parasitic zero. Other embodiments include corresponding systems and apparatus, each configured to perform various embodiment methods.

In various embodiments, the circuit further includes a capacitive sensor configured to generate a signal output voltage, and an amplifier coupled to the capacitive sensor and configured to receive the signal output voltage at a high impedance input of the amplifier, where the high-Ω resistor has a first terminal coupled to the capacitive sensor and the high impedance input of the amplifier. In some embodiments, the high-Ω resistor has a second terminal coupled to a signal output of the amplifier. In other embodiments, the high-Ω resistor has a second terminal coupled to a reference supply terminal. The circuit may also include a bias voltage circuit coupled to the capacitive sensor and configured to generate a bias voltage and provide the bias voltage to the capacitive sensor. In further embodiments, the capacitive sensor includes a MEMS microphone.

In various embodiments, each semiconductor junction device of the plurality of semiconductor junction devices includes a diode connected transistor. In some embodiments, the diode connected transistor of each semiconductor junction device of the plurality of semiconductor junction devices includes a p-type MOSFET having a gate shorted to a source/drain terminal, where the parasitic doped well capacitance includes a parasitic capacitance formed between a substrate bulk and an n-well of the p-type MOSFET for each semiconductor junction device of the plurality of semiconductor junction devices.

In various embodiments, each additional capacitance of the plurality of additional capacitances is formed in a respective doped well of a respective one semiconductor junction device of the plurality of semiconductor junction devices. In some embodiments, each additional capacitance of the plurality of additional capacitances includes a first capacitor-coupled field effect transistor (FET) that is formed in the respective doped well of the respective one semiconductor junction device of the plurality of semiconductor junction devices, where the respective one semiconductor junction device and the first capacitor-coupled FET have shared first and second conduction terminals. In further embodiments, each additional capacitance of the plurality of additional capacitances further includes a second capacitor-coupled FET that is formed in the respective doped well of the respective one semiconductor junction device of the plurality of semiconductor junction devices, and where the respective one semiconductor junction device, the first capacitor-coupled FET, and the second capacitor-coupled FET have shared first and second conduction terminals.

In various embodiments, each additional capacitance of the plurality of additional capacitances includes capacitive plates that are formed in a respective doped well of a respective one semiconductor junction device of the plurality of semiconductor junction devices, and the respective one semiconductor junction device and the capacitive plates have shared first and second conduction terminals.

According to an embodiment, an integrated circuit includes a first resistor terminal, a second resistor terminal, a first plurality of series connected semiconductor junction devices disposed in a substrate and forming a first series path from the first resistor terminal to the second resistor terminal, a first plurality of additional capacitances disposed at the substrate and coupled in parallel with the first plurality of series connected semiconductor junction devices, a second plurality of series connected semiconductor junction devices disposed in the substrate and forming a second series path from the first resistor terminal to the second resistor terminal, and a second plurality of additional capacitances disposed at the substrate and coupled in parallel with the second plurality of series connected semiconductor junction devices. Each semiconductor junction device of the first plurality of series connected semiconductor junction devices is disposed in a separate respective doped well in the substrate, and each semiconductor junction device of the second plurality of series connected semiconductor junction devices is disposed in a separate respective doped well in the substrate. Other embodiments include corresponding systems and apparatus, each configured to perform various embodiment methods.

In various embodiments, the integrated circuit further includes a capacitive sensor having an output coupled to the first resistor terminal, and an amplifier having a high impedance input coupled to the output of the capacitive sensor and the first resistor terminal. In some embodiments, each additional capacitance of the first plurality of additional capacitances is coupled in parallel across a respective separate one semiconductor junction device of the first plurality of series connected semiconductor junction devices and formed in the separate respective doped well of the respective separate one semiconductor junction device of the first plurality of series connected semiconductor junction devices. In such embodiments, each additional capacitance of the second plurality of additional capacitances is coupled in parallel across a respective separate one semiconductor junction device of the second plurality of series connected semiconductor junction devices and formed in the separate respective doped well of the respective separate one semiconductor junction device of the second plurality of series connected semiconductor junction devices.

In various embodiments, each semiconductor junction device of the first plurality of series connected semiconductor junction devices includes a diode connected transistor, and each semiconductor junction device of the second plurality of series connected semiconductor junction devices includes a diode connected transistor. In some embodiments, the diode connected transistor of each semiconductor junction device of the first plurality of series connected semiconductor junction devices includes a p-type MOSFET having a gate shorted to a source/drain terminal and having a parasitic capacitance between the substrate and an n-well, and the diode connected transistor of each semiconductor junction device of the second plurality of series connected semiconductor junction devices includes a p-type MOSFET having a gate shorted to a source/drain terminal and having a parasitic capacitance between the substrate and an n-well.

In various embodiments, each additional capacitance of the first plurality of additional capacitances includes a first capacitor-coupled FET formed in the n-well of the p-type MOSFET of a respective diode connected transistor of each semiconductor junction device of the first plurality of series connected semiconductor junction devices, and each additional capacitance of the second plurality of additional capacitances includes a first capacitor-coupled FET formed in the n-well of the p-type MOSFET of a respective diode connected transistor of each semiconductor junction device of the second plurality of series connected semiconductor junction devices.

In various embodiments, each additional capacitance of the first plurality of additional capacitances further includes a second capacitor-coupled FET formed in the n-well of the p-type MOSFET of the respective diode connected transistor of each semiconductor junction device of the first plurality of series connected semiconductor junction devices, and each additional capacitance of the second plurality of additional capacitances further includes a second capacitor-coupled FET formed in the n-well of the p-type MOSFET of the respective diode connected transistor of each semiconductor junction device of the second plurality of series connected semiconductor junction devices.

In various embodiments, each additional capacitance of the first plurality of additional capacitances includes capacitive plates disposed at the substrate, and each additional capacitance of the second plurality of additional capacitances includes capacitive plates disposed at the substrate.

According to an embodiment, a sensing circuit includes a capacitive sensor configured to generate a signal output voltage at a signal output terminal, an amplifier coupled to the capacitive sensor and configured to receive the signal output voltage at a high impedance input terminal, and an integrated high-$\Omega$ resistor. The integrated high-$\Omega$ resistor includes a first resistor terminal coupled to the signal output terminal and the high impedance input terminal, a second resistor terminal, and a first plurality of resistive cells disposed in a substrate and forming a first series path from the first resistor terminal to the second resistor terminal. Each resistive cell of the first plurality of resistive cells includes a semiconductor junction device disposed in the substrate and an additional capacitance disposed at the substrate and coupled in parallel with the semiconductor junction device. Other embodiments include corresponding systems and apparatus, each configured to perform various embodiment methods.

In various embodiments, the sensing circuit further includes a bias voltage circuit coupled to the capacitive sensor and configured to generate a bias voltage and provide the bias voltage to the capacitive sensor. In some embodiments, the capacitive sensor includes a MEMS microphone. The second resistor terminal may be coupled to a reference node. In other embodiments, the second resistor terminal is coupled in a feedback configuration to an output of the amplifier.

In various embodiments, for each resistive cell of the first plurality of resistive cells, the semiconductor junction device includes a diode connected transistor. In some embodiments, for each resistive cell of the first plurality of resistive cells, the diode connected transistor includes a p-type MOSFET having a gate shorted to a source/drain terminal and having a parasitic capacitance between the substrate and an n-well. In further embodiments, for each resistive cell of the first plurality of resistive cells, the additional capacitance includes a first capacitor-coupled FET formed in the n-well. In still further embodiments, for each resistive cell of the first plurality of resistive cells, the additional capacitance includes a second capacitor-coupled FET formed in the n-well. In other embodiments, for each resistive cell of the first plurality of resistive cells, the additional capacitance includes conductive capacitive plates disposed at the substrate.

According to an embodiment, a method of operating a sensing circuit includes generating a signal output voltage at a capacitive sensor, receiving the signal output voltage at an amplifier, and biasing the capacitive sensor using a high-Ω bias resistor including a plurality of resistive cells coupled in series. Each resistive cell of the plurality of resistive cells includes a semiconductor junction device including a parasitic capacitance of a doped well configured to insert a parasitic zero in a noise transfer function of the high-Ω bias resistor, and an additional capacitance configured to adjust a parasitic pole in the noise transfer function of the high-Ω bias resistor in order to compensate for the parasitic zero. Other embodiments include corresponding systems and apparatus, each configured to perform various embodiment methods.

In various embodiments, for each resistive cell of the plurality of resistive cells, the additional capacitance is disposed in the doped well of the semiconductor junction device.

Advantages of various embodiments described herein may include high-Ω resistors for various capacitive systems that produce less noise or increase SNR.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
a high-resistance resistor comprising:
a plurality of semiconductor junction devices coupled in series, each semiconductor junction device of the plurality of semiconductor junction devices comprising a parasitic doped well capacitance configured to insert a parasitic zero in a noise transfer function of the high-resistance resistor, wherein each semiconductor junction device of the plurality of semiconductor junction devices comprises a diode connected transistor,
a plurality of additional capacitors, wherein ones of the plurality of additional capacitors are formed in parallel with corresponding ones of the plurality of semiconductor junction devices, and each additional capacitor of the plurality of additional capacitors are configured to adjust a parasitic pole in the noise transfer function of the high-resistance resistor in order to compensate for the parasitic zero,
a capacitive sensor configured to generate a signal output voltage, and
an amplifier coupled to the capacitive sensor and configured to receive the signal output voltage at a high impedance input of the amplifier, wherein the high-resistance resistor has a first terminal coupled to the capacitive sensor and the high impedance input of the amplifier.

2. A circuit comprising:
a high-resistance resistor comprising:
a plurality of semiconductor junction devices coupled in series, each semiconductor junction device of the plurality of semiconductor junction devices comprising a parasitic doped well capacitance configured to insert a parasitic zero in a noise transfer function of the high-resistance resistor, and
a plurality of additional capacitors, wherein ones of the plurality of additional capacitors are formed in parallel with corresponding ones of the plurality of semiconductor junction devices, and each additional capacitor of the plurality of additional capacitors are configured to adjust a parasitic pole in the noise transfer function of the high-resistance resistor in order to compensate for the parasitic zero;
a capacitive sensor configured to generate a signal output voltage; and
an amplifier coupled to the capacitive sensor and configured to receive the signal output voltage at a high impedance input of the amplifier, wherein the high-resistance resistor has a first terminal coupled to the capacitive sensor and the high impedance input of the amplifier, wherein the high-resistance resistor has a second terminal coupled to a signal output of the amplifier.

3. The circuit of claim 1, wherein the high-resistance resistor has a second terminal coupled to a reference supply terminal.

4. A circuit comprising:
a high-resistance resistor comprising:
a plurality of semiconductor junction devices coupled in series, each semiconductor junction device of the plurality of semiconductor junction devices comprising a parasitic doped well capacitance configured to insert a parasitic zero in a noise transfer function of the high-resistance resistor, and
a plurality of additional capacitors, wherein ones of the plurality of additional capacitors are formed in parallel with corresponding ones of the plurality of semiconductor junction devices, and each additional capacitor of the plurality of additional capacitors are configured to adjust a parasitic pole in the noise transfer function of the high-resistance resistor in order to compensate for the parasitic zero;
a capacitive sensor configured to generate a signal output voltage;
an amplifier coupled to the capacitive sensor and configured to receive the signal output voltage at a high impedance input of the amplifier, wherein the high-resistance resistor has a first terminal coupled to the capacitive sensor and the high impedance input of the amplifier; and
a bias voltage circuit coupled to the capacitive sensor and configured to generate a bias voltage and provide the bias voltage to the capacitive sensor.

5. The circuit of claim 1, wherein the capacitive sensor comprises a microelectromechanical systems (MEMS) microphone.

6. The circuit of claim 1, wherein the diode connected transistor of each semiconductor junction device of the plurality of semiconductor junction devices comprises a p-type metal oxide semiconductor field effect transistor (MOSFET) having a gate shorted to a source/drain terminal, wherein the parasitic doped well capacitance comprises a parasitic capacitance formed between a substrate bulk and an n-well of the p-type MOSFET for each semiconductor junction device of the plurality of semiconductor junction devices.

7. A circuit comprising:
a high-resistance resistor comprising:
a plurality of semiconductor junction devices coupled in series, each semiconductor junction device of the plurality of semiconductor junction devices comprising a parasitic doped well capacitance configured to insert a parasitic zero in a noise transfer function of the high-resistance resistor, and a plurality of additional capacitors, wherein ones of the plurality of additional capacitors are formed in parallel with corresponding ones of the plurality of semiconductor junction devices, and each additional capacitor of the plurality of additional capacitors are configured to adjust a parasitic pole in the noise transfer function of the high-resistance resistor in order to compensate for the parasitic zero, wherein each additional capacitor of the plurality of additional capacitors is formed in a respective doped well of a respective one semiconductor junction device of the plurality of semiconductor junction devices, a capacitive sensor configured to generate a signal output voltage, and an amplifier coupled to the capacitive sensor and configured to receive the signal output voltage at a high impedance input of the amplifier, wherein the high-resistance resistor has a first terminal coupled to the capacitive sensor and the high impedance input of the amplifier.

8. The circuit of claim 7, wherein each additional capacitor of the plurality of additional capacitors comprises a first capacitor-coupled field effect transistor (FET) that is formed in the respective doped well of the respective one semiconductor junction device of the plurality of semiconductor junction devices, the respective one semiconductor junction device and the first capacitor-coupled FET having shared first and second conduction terminals.

9. The circuit of claim 8, wherein each additional capacitor of the plurality of additional capacitors further comprises a second capacitor-coupled FET that is formed in the respective doped well of the respective one semiconductor junction device of the plurality of semiconductor junction devices, and wherein the respective one semiconductor junction device, the first capacitor-coupled FET, and the second capacitor-coupled FET have shared first and second conduction terminals.

10. The circuit of claim 1, wherein each additional capacitor of the plurality of additional capacitors comprises capacitive plates that are formed in a respective doped well of a respective one semiconductor junction device of the plurality of semiconductor junction devices, and wherein the respective one semiconductor junction device and the capacitive plates have shared first and second conduction terminals.

11. An integrated circuit comprising:
a first resistor terminal;
a second resistor terminal;
a first plurality of series connected semiconductor junction devices disposed in a substrate and forming a first series path from the first resistor terminal to the second resistor terminal, wherein each semiconductor junction device of the first plurality of series connected semiconductor junction devices is disposed in a separate respective doped well in the substrate;
a first plurality of additional capacitors disposed at the substrate, wherein ones of the first plurality of additional capacitors are coupled in parallel with corresponding ones of the first plurality of series connected semiconductor junction devices;
a second plurality of series connected semiconductor junction devices disposed in the substrate and forming a second series path from the first resistor terminal to the second resistor terminal, wherein each semiconductor junction device of the second plurality of series connected semiconductor junction devices is disposed in a separate respective doped well in the substrate; and a second plurality of additional capacitors disposed at the substrate, wherein ones of the second plurality of additional capacitors are coupled in parallel with corresponding ones of the second plurality of series connected semiconductor junction devices.

12. The integrated circuit of claim 11, further comprising:
a capacitive sensor having an output coupled to the first resistor terminal; and
an amplifier having a high impedance input coupled to the output of the capacitive sensor and the first resistor terminal.

13. The integrated circuit of claim 12, wherein:
each additional capacitor of the first plurality of additional capacitors is coupled in parallel across a respective separate one semiconductor junction device of the first plurality of series connected semiconductor junction devices and formed in the separate respective doped well of the respective separate one semiconductor junction device of the first plurality of series connected semiconductor junction devices; and
each additional capacitor of the second plurality of additional capacitors is coupled in parallel across a respective separate one semiconductor junction device of the second plurality of series connected semiconductor junction devices and formed in the separate respective doped well of the respective separate one semiconductor junction device of the second plurality of series connected semiconductor junction devices.

14. The integrated circuit of claim 12, wherein:
each semiconductor junction device of the first plurality of series connected semiconductor junction devices comprises a diode connected transistor; and
each semiconductor junction device of the second plurality of series connected semiconductor junction devices comprises a diode connected transistor.

15. The integrated circuit of claim 14, wherein:
the diode connected transistor of each semiconductor junction device of the first plurality of series connected semiconductor junction devices comprises a p-type metal oxide semiconductor field effect transistor (MOSFET) having a gate shorted to a source/drain terminal and having a parasitic capacitance between the substrate and an n-well; and
the diode connected transistor of each semiconductor junction device of the second plurality of series connected semiconductor junction devices comprises a p-type MOSFET having a gate shorted to a source/drain terminal and having a parasitic capacitance between the substrate and an n-well.

16. The integrated circuit of claim 15, wherein:
each additional capacitor of the first plurality of additional capacitors comprises a first capacitor-coupled field effect transistor (FET) formed in the n-well of the p-type MOSFET of a respective diode connected transistor of each semiconductor junction device of the first plurality of series connected semiconductor junction devices; and
each additional capacitor of the second plurality of additional capacitors comprises a first capacitor-coupled FET formed in the n-well of the p-type MOSFET of a respective diode connected transistor of each semiconductor junction device of the second plurality of series connected semiconductor junction devices.

17. The integrated circuit of claim 16, wherein:

each additional capacitor of the first plurality of additional capacitors further comprises a second capacitor-coupled FET formed in the n-well of the p-type MOSFET of the respective diode connected transistor of each semiconductor junction device of the first plurality of series connected semiconductor junction devices; and each additional capacitor of the second plurality of additional capacitors further comprises a second capacitor-coupled FET formed in the n-well of the p-type MOSFET of the respective diode connected transistor of each semiconductor junction device of the second plurality of series connected semiconductor junction devices.

18. The integrated circuit of claim 12, wherein:

each additional capacitor of the first plurality of additional capacitors comprises capacitive plates disposed at the substrate; and each additional capacitor of the second plurality of additional capacitors comprises capacitive plates disposed at the substrate.

19. A sensing circuit comprising:

a capacitive sensor configured to generate a signal output voltage at a signal output terminal, wherein the capacitive sensor comprises a microelectromechanical systems (MEMS) microphone;

an amplifier coupled to the capacitive sensor and configured to receive the signal output voltage at a high impedance input terminal;

an integrated high-resistance resistor comprising:
  a first resistor terminal coupled to the signal output terminal and the high impedance input terminal,
  a second resistor terminal, and
  a first plurality of resistive cells disposed in a substrate and forming a first series path from the first resistor terminal to the second resistor terminal, wherein each resistive cell of the first plurality of resistive cells comprises a semiconductor junction device disposed in the substrate and an additional capacitor disposed at the substrate and coupled in parallel with the semiconductor junction device; and a bias voltage circuit coupled to the capacitive sensor and configured to generate a bias voltage and provide the bias voltage to the capacitive sensor.

20. The sensing circuit of claim 19, wherein the second resistor terminal is coupled to a reference node.

21. The sensing circuit of claim 19, wherein the second resistor terminal is coupled in a feedback configuration to an output of the amplifier.

22. The sensing circuit of claim 19, wherein, for each resistive cell of the first plurality of resistive cells, the semiconductor junction device comprises a diode connected transistor.

23. The sensing circuit of claim 22, wherein, for each resistive cell of the first plurality of resistive cells, the diode connected transistor comprises a p-type metal oxide semiconductor field effect transistor (MOSFET) having a gate shorted to a source/drain terminal and having a parasitic capacitance between the substrate and an n-well.

24. The sensing circuit of claim 23, wherein, for each resistive cell of the first plurality of resistive cells, the additional capacitor comprises a first capacitor-coupled field effect transistor (FET) formed in the n-well.

25. The sensing circuit of claim 24, wherein, for each resistive cell of the first plurality of resistive cells, the additional capacitor comprises a second capacitor-coupled FET formed in the n-well.

26. The sensing circuit of claim 19, wherein, for each resistive cell of the first plurality of resistive cells, the additional capacitor comprises conductive capacitive plates disposed at the substrate.

\* \* \* \* \*